United States Patent [19]

Kimura et al.

[11] Patent Number: 6,117,354
[45] Date of Patent: Sep. 12, 2000

[54] PIEZOELECTRIC CERAMIC COMPOSITION

[75] Inventors: Masahiko Kimura, Shiga-ken; Akira Ando, Omihachiman; Tadahiro Minamikawa, Shiga-ken, all of Japan

[73] Assignee: Murata Manufacturing Co., Ltd., Japan

[21] Appl. No.: 09/312,247

[22] Filed: May 14, 1999

[30] Foreign Application Priority Data

May 20, 1998 [JP] Japan .................................. 10-156648

[51] Int. Cl.$^7$ ........................ C04B 35/433; C04B 35/495
[52] U.S. Cl. .................................... 252/62.9 R; 501/134; 501/135
[58] Field of Search ....................... 252/62.9 R; 501/134, 501/135

[56] References Cited

FOREIGN PATENT DOCUMENTS 48-77398  10/1973  Japan .
48-78500  10/1973  Japan .

*Primary Examiner*—C. Melissa Koslow
*Attorney, Agent, or Firm*—Ostrolenk, Faber, Gerb & Soffen, LLP

[57] ABSTRACT

A piezoelectric ceramic composition which contains a ceramic compound and manganese. The ceramic compound serves as a primary component and is represented by formula $(Sr_{1-x}M_x)Bi_2Nb_2O_9$. In the formula, M represents a divalent metal element and x satisfies $0 \leq x \leq 0.3$. Manganese is contained in an amount of 1.0 wt. % or less (0 being excluded) as $MnCO_3$.

4 Claims, No Drawings

PIEZOELECTRIC CERAMIC COMPOSITION

BACKGROUND OF THE INVENTION

1. Field of the Invention

The present invention relates to a piezoelectric ceramic composition, and more particularly to a piezoelectric ceramic composition useful as a material for producing piezoelectric ceramic elements such as piezoelectric ceramic filters and piezoelectric ceramic oscillators.

2. Background Art

Piezoelectric ceramic compositions predominantly comprising lead titanate zirconate ($Pb(Ti_xZr_{1-x}, O_3)$) or lead titanate ($PbTiO_3$) have been widely used for the production of piezoelectric ceramic elements such as piezoelectric ceramic filters and piezoelectric ceramic oscillators. Piezoelectric ceramic compositions predominantly comprising lead titanate zirconate or lead titanate are generally produced by use of lead oxides, which cause a reduction in homogeneity of products due to evaporation of lead oxides. In contrast, piezoelectric ceramic compositions predominantly comprising a layered bismuth compound represented by $(Sr_{1-x}M_x)Bi_2Nb_2O_9$ contain no lead oxide and therefore do not introduce this type of problem.

However, piezoelectric ceramic compositions predominantly comprising a layered bismuth compound have a small electromechanical coupling coefficient kt and therefore have not yet been widely used in practice.

SUMMARY OF THE INVENTION

In view of the foregoing, the present inventors conducted earnest studies to improve electromechanical coupling coefficient kt of a piezoelectric ceramic composition predominantly comprising a layered bismuth compound to thereby provide a piezoelectric ceramic composition which, when used as a material for the production of piezoelectric ceramic elements, exhibits a practical, acceptable electromechanical coupling coefficient kt value (more than 10%).

The piezoelectric ceramic composition according to the present invention comprises a ceramic compound and manganese, wherein the ceramic compound serves as a primary component and is represented by formula $(Sr_{1-x}M_x)Bi_2Nb_2O_9$ wherein M represents a divalent metal element and x satisfies $0 \leq x \leq 0.3$, and the manganese is contained in an amount of 1.0 wt. % or less (0 being excluded) calculated as $MnCO_3$. The aforementioned parameter x is limited to 0–0.3 because if x falls outside the range, the effect of the present invention is not appreciable and an electromechanical coupling coefficient kt which enables the piezoelectric ceramic composition to serve in practice cannot be obtained. The amount of manganese is limited to 1.0% by weight or less (0 being excluded) as $MnCO_3$ because when the manganese content falls outside the specified range, polarizable ceramics cannot be obtained.

Moreover, the effect of the present invention is particularly excellent when M in the formula is at least one element selected from Ca and Ba. Ca and Ba may both be contained as M.

The above and other objects, features, and advantages of the present invention will be more clearly understood from the below-described description of preferred embodiments of the invention.

DETAILED DESCRIPTION OF PREFERRED EMBODIMENTS

The present invention will next be described in more detail.

A variety of piezoelectric ceramic samples were prepared according to the following method.

Starting raw materials, SrO, $Bi_2O_3$, $Nb_2O_5$, CaO, BaO and $MnCO_3$ were provided and were weighed so as to form a compound of the formula $(Sr_{1-x}M_x)Bi_2Nb_2O_9$ wherein M represents a divalent metal element and x satisfies $0 \leq x \leq 0.3$, followed by wet-mixing for about four hours by use of a ball mill. The resultant mixture was dried and then calcined at 700–900° C. Subsequently, the dried mixture was roughly crushed, wet-milled with an appropriate amount of an organic binder for four hours by use of a ball mill and passed through a 40-mesh sieve to thereby regulate the particle size of the milled powder. Subsequently, the particle-size-regulated powder was molded at 1000 kg/cm² into a disk having a diameter of 12.5 mm and a thickness of 1 mm, and the disk was fired in air to thereby form a ceramic disk. After silver electrodes were formed on the surfaces (both main surfaces) of the ceramic disk by applying and burning a silver paste through a customary method, the disk was subjected to a polarization treatment by the application of a DC voltage of 5–20 kV/mm for 10–30 minutes in a 150° C.–200° C. insulating oil to thereby obtain a piezoelectric ceramic serving as a sample. The sample was subjected to measurement of density, resistivity, and electromechanical coupling coefficient kt. The results are shown in Table 1.

TABLE 1

| Sample No. | M | x | $MnCO_3$ (wt %) | Density (g/cm³) | Resistivity (Ω · cm) | kt (%) |
|---|---|---|---|---|---|---|
| *1 | — | 0 | 0 | 6.75 | $2.0 \times 10^{11}$ | 8.5 |
| 2 | — | 0 | 0.1 | 7.05 | $4.0 \times 10^{13}$ | 20.5 |
| 3 | — | 0 | 0.5 | 6.96 | $6.0 \times 10^{12}$ | 17.6 |
| 4 | — | 0 | 1.0 | 6.80 | $4.0 \times 10^{12}$ | 16.8 |
| *5 | — | 0 | 1.1 | 6.67 | $2.0 \times 10^{10}$ | Not polarizable |
| *6 | Ca | 0.1 | 0 | 6.80 | $2.0 \times 10^{11}$ | 8.8 |
| 7 | Ca | 0.1 | 0.1 | 7.08 | $5.0 \times 10^{13}$ | 22.9 |
| 8 | Ca | 0.1 | 1.0 | 6.70 | $4.0 \times 10^{12}$ | 19.7 |
| *9 | Ca | 0.1 | 1.1 | 6.65 | $2.0 \times 10^{10}$ | Not polarizable |
| *10 | Ca | 0.3 | 0 | 6.65 | $2.0 \times 10^{11}$ | 8.5 |
| 11 | Ca | 0.3 | 0.1 | 6.98 | $4.0 \times 10^{13}$ | 17.9 |
| 12 | Ca | 0.3 | 1.0 | 6.67 | $2.0 \times 10^{12}$ | 17.6 |
| *13 | Ca | 0.3 | 1.1 | 6.44 | $1.0 \times 10^{10}$ | Not polarizable |
| *14 | Ca | 0.4 | 0.1 | 6.26 | $7.0 \times 10^{9}$ | 9.6 |
| *15 | Ba | 0.1 | 0 | 6.85 | $2.0 \times 10^{11}$ | 8.7 |
| 16 | Ba | 0.1 | 0.1 | 7.07 | $3.0 \times 10^{13}$ | 21.9 |
| *17 | Ba | 0.1 | 1.1 | 6.65 | $1.0 \times 10^{10}$ | Not polarizable |
| *18 | Ba | 0.3 | 0 | 6.67 | $9.0 \times 10^{10}$ | 8.4 |
| 19 | Ba | 0.3 | 0.1 | 7.00 | $1.0 \times 10^{13}$ | 20.9 |
| *20 | Ba | 0.3 | 1.1 | 6.47 | $2.0 \times 10^{10}$ | Not polarizable |
| *21 | Ba | 0.4 | 0.1 | 6.31 | $8.0 \times 10^{9}$ | 9.1 |

Samples marked with * fall outside the scope of invention.

As is apparent from Table 1, each of sample Nos. 2, 3, 4, 7, 8, 11, 12, 16 and 19, which fall within the scope of the present invention, has an improved electromechanical coupling coefficient kt as compared with sample Nos. 1, 5, 6, 9, 10, 13, 14, 15, 17, 18, 20 and 21, which fall outside the scope of the present invention.

According to the present invention, electromechanical coupling coefficient kt of the piezoelectric ceramic composition which predominantly comprises a layered bismuth compound can be improved, and a piezoelectric ceramic composition useful as a material for piezoelectric ceramic elements such as piezoelectric ceramic filters and piezoelectric ceramic oscillators can be advantageously produced.

What is claimed is:

1. A piezoelectric ceramic composition comprising a ceramic compound and manganese, wherein the ceramic compound is the primary component and is represented by the formula $(Sr_{1-x}M_x)Bi_2Nb_2O_9$ wherein M represents at least one divalent metal element and $0 \leq x \leq 0.3$, and the manganese is in an amount of 1.0 wt. % or less (0 being excluded) calculated as $MnCO_3$.

2. A piezoelectric ceramic composition according to claim 1, wherein M is at least one of Ca and Ba.

3. A piezoelectric ceramic composition according to claim 1, wherein M is Ca and the manganese amount is 0.1 to 1.0 wt. % calculated as $MnCO_3$.

4. A piezoelectric ceramic composition according to claim 1, wherein M is Ba and the manganese amount is 0.1 to 1.0 wt. % calculated as $MnCO_3$.

* * * * *